United States Patent [19]

Braun

[11] 4,330,820
[45] May 18, 1982

[54] CIRCUIT FOR FORMING PERIODIC PULSE PATTERNS

[75] Inventor: Rüdiger Braun, Erlangen, Fed. Rep. of Germany

[73] Assignee: Siemens Aktiengesellschaft, Munich, Fed. Rep. of Germany

[21] Appl. No.: 44,931

[22] Filed: Jun. 4, 1979

[30] Foreign Application Priority Data

Jul. 18, 1978 [DE] Fed. Rep. of Germany ....... 2831589

[51] Int. Cl.³ .......................... H03K 3/64; H03K 3/78
[52] U.S. Cl. .................................. 363/135; 328/119; 328/105; 328/62
[58] Field of Search ..................... 328/119, 61, 62, 63, 328/105; 363/135

[56] References Cited

U.S. PATENT DOCUMENTS

| | | | |
|---|---|---|---|
| 3,510,777 | 5/1970 | Gordon | 328/119 X |
| 3,639,848 | 2/1972 | Elliott | 328/119 X |
| 3,894,287 | 7/1975 | Mathiesen | 328/119 X |
| 3,913,100 | 10/1975 | Janex | 328/119 X |
| 4,011,517 | 3/1977 | Pommerening et al. | 328/119 X |
| 4,169,264 | 9/1979 | Parker | 328/119 X |

*Primary Examiner*—John S. Heyman
*Attorney, Agent, or Firm*—Kenyon & Kenyon

[57] ABSTRACT

A circuit arrangement for the formation of periodic pulse patterns for use in controlling converters which is capable of quick change of circuit arrangement without time wasted in adjustment and capable of use in different applications without need to change circuit. The circuit arrangement of the invention is also useful for the formation of a periodic pulse pattern which is variable as a function of a control signal. For this purpose the desired pulse pattern is formed of auxiliary patterns stored in a number of memories. An oscillator drives a binary-coded counter which forms the addresses for a memory in which the desired pulse pattern is stored. The address inputs of at least one of these memories are connected to the output of the counter by means of an arrangement for address shifting which responds to a control signal.

3 Claims, 10 Drawing Figures

| MEMORY ADDRESS | | MEMORY CONTENTS | | | |
|---|---|---|---|---|---|
| 0 0 0 0 0 0 0 | (0) | 0 | 0 | 0 | 0 |
| 0 0 0 0 0 0 1 | (1) | 0 | 0 | 0 | 0 |
| 0 0 0 0 0 1 0 | (2) | 0 | 0 | 0 | 0 |
| 0 0 0 0 0 1 1 | (3) | 0 | 0 | 0 | 0 |
| 0 0 0 0 1 0 0 | (4) | 0 | 0 | 1 | 0 |
| 0 0 0 0 1 0 1 | (5) | 0 | 0 | 1 | 0 |
| 0 0 0 0 1 1 0 | (6) | 0 | 0 | 1 | 0 |
| 0 0 0 0 1 1 1 | (7) | 0 | 0 | 1 | 0 |
| 0 0 0 0 1 0 0 0 | (8) | 0 | 0 | 0 | 0 |
| 0 0 0 0 1 0 0 1 | (9) | 0 | 0 | 0 | 0 |
| 0 0 0 0 1 0 1 0 | (10) | 0 | 1 | 0 | 0 |
| 0 0 0 0 1 0 1 1 | (11) | 0 | 1 | 0 | 0 |
| 0 0 0 0 1 1 0 0 | (12) | 0 | 1 | 0 | 0 |
| ⋮ | ⋮ | ⋮ | ⋮ | ⋮ | ⋮ |
| 0 1 1 1 1 1 1 0 | (126) | 0 | 1 | 0 | 0 |
| 0 1 1 1 1 1 1 1 | (127) | 0 | 1 | 0 | 0 |
| 1 0 0 0 0 0 0 0 | (128) | 0 | 0 | 0 | 0 |
| 1 0 0 0 0 0 0 1 | (129) | 0 | 0 | 0 | 0 |
| 1 0 0 0 0 0 1 0 | (130) | 0 | 0 | 0 | 0 |
| 1 0 0 0 0 0 1 1 | (131) | 0 | 0 | 0 | 0 |
| 1 0 0 0 0 1 0 0 | (132) | 0 | 0 | 0 | 1 |
| 1 0 0 0 0 1 0 1 | (133) | 0 | 0 | 0 | 1 |
| 1 0 0 0 0 1 1 0 | (134) | 0 | 0 | 0 | 1 |
| 1 0 0 0 0 1 1 1 | (135) | 0 | 0 | 0 | 1 |
| 1 0 0 0 1 0 0 0 | (136) | 0 | 0 | 0 | 0 |
| 1 0 0 0 1 0 0 1 | (137) | 0 | 0 | 0 | 0 |
| 1 0 0 0 1 0 1 0 | (138) | 1 | 0 | 0 | 0 |
| 1 0 0 0 1 0 1 1 | (139) | 1 | 0 | 0 | 0 |
| 1 0 0 0 1 1 0 0 | (140) | 1 | 0 | 0 | 0 |
| ⋮ | ⋮ | ⋮ | ⋮ | ⋮ | ⋮ |
| 1 1 1 1 1 1 1 1 | (255) | 1 | 0 | 0 | 0 |
| 0 0 0 0 0 0 0 0 | (256) | 0 | 0 | 0 | 0 |
| | | ↓ n1 | ↓ n2 | ↓ n3 | ↓ n4 |

FIG 4

CIRCUIT FOR FORMING PERIODIC PULSE PATTERNS

BACKGROUND OF THE INVENTION

1. Field of the Invention

This invention relates to circuits for producing periodic pulse patterns for use in controlling rectifiers (converters). More particularly, the invention relates to circuits in which the desired pulse patterns are stored in a memory which is addressed by a binary coded counter driven by an oscillator.

2. Discussion of the Prior Art

Heretofore, circuit arrangements for the formation of periodic pulse patterns used, in particular, for the control of rectifiers have been designed in analog technology. The components, such as amplifiers, reference voltage generators, and comparators, had to be adjusted and compensation of drift errors was required. It was necessary to develop and build different pulse-forming circuits for different converters and to use different control methods. The conception of control methods had to take into account the realizability of their respective circuitry.

It is an object of the present invention to provide a simple circuit arrangement for the formation of periodic pulse patterns which is produced without requiring much adjustment work and which can be used in different applications without change in circuit form.

SUMMARY OF THE INVENTION

According to the invention, this problem is solved by means of an oscillator which drives a binary coded counter and which forms the addresses for a memory in which the desired pulse pattern is stored.

The digital timing provided in the circuit arrangement taught by the invention makes it possible to realize any periodic pulse pattern for the most varied range of applications. The accuracy of the pulse pattern generated is determined solely by the number of digital counter outputs and the thus obtainable division of a period into increments. Since counters and memories have no operationally revelant spread between units, no adjusting labor is required. The oscillator frequency which ultimately determines the period can be kept sufficiently constant by using suitable oscillators.

If the application requires a variable period, a controllable oscillator may be used, e.g. a voltage-to-frequency converter. The circuit arrangement of the invention can be adapted to the greatest variety of applications by appropriately programming the pulse pattern memory.

According to the invention, a circuit arrangement can also be designed for the formation of a periodic pulse pattern which is variable in response to a control signal. For this purpose, an embodiment of the invention provides for the formation of the desired pulse pattern from auxiliary pulse patterns stored in a number of memories, the address inputs of at least one memory being connected to the counter output via an arrangement for address shifting as a function of the control signal.

In this manner it is possible to take higher ranking control processes into consideration when forming the pulse patterns.

An arrangement for address shifting may be provided in the form of an adder or substracter whose sum or difference output is connected to the address input of at least one memory and whose first addend or minuend input is acted upon by the counter content and to whose second addend or minuend input a number dependent on the control signal is applied.

According to another aspect of the invention, nonlinear relationships between the control signal and the shape of the desired pulse pattern can be taken into account by connecting the second addend input of the adder of the subtracted input of the subtracter to the output of another memeory, to whose addressing input the number determined by the control signal is applied.

The invention finds its preferred application in control units for converters and, in particular, for inverters. In the simplest case, one pulse pattern memory output is associated with each converter valve. This immediately provides for uncontrolled operation of the converter by means of a fixed firing pulse pattern. For controlled converter operation the desired pulse patterns are derived from auxiliary pulse patterns stored in several memories in the manner already described. In any case, the memories which are used contain the instructions for driving the converter valves.

The invention will now be explained in detail by means of an illustrative embodiment in its preferred field of application, the control of converters. The converter chosen by way of example is a two-pulse inverter whose controlled semiconductor valves can be controlled by firing pulses according to different control methods, and in particular, with a fixed firing pulse pattern, phase gating or pulse control. The firing pulses of a control unit are transmitted to the control paths of the controlled valves via pulse amplifiers, which are preferably keyable pulse generators, and pulse transformers or via optical or high-frequency transmission systems. For understanding the invention it is important to understand, merely, that the control unit generates firing pulses for the controlled valves of the inverter.

BRIEF DESCRIPTION OF THE DRAWINGS

FIG. 4 shows the programming of the pulse pattern memory used in the control unit of FIG. 2;

DETAILED DESCRIPTION OF THE INVENTION

Figure 1:
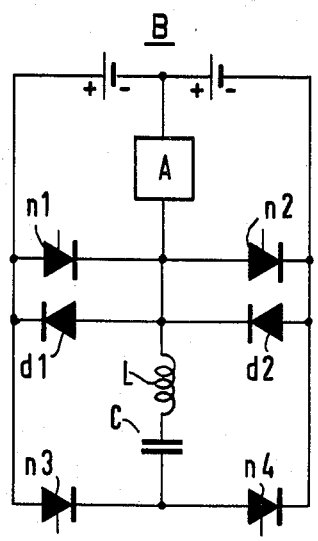
FIG. 1 shows a schematic diagram of the circuit of a two-pulse inverter.

FIG. 1 shows the circuit of a known bridge-connected inverter having forced commutation in which back-connected diodes d1 and d2 are connected antiparallel to controlled main valves n1 and n2. An LC series-resonant circuit is provided as common commutation circuit, being connectable via quenching valves n3 and n4. Load A is connected between the center of DC source B and the center of the bridge leg containing the controlled main valves n1, n2.

Figure 2:
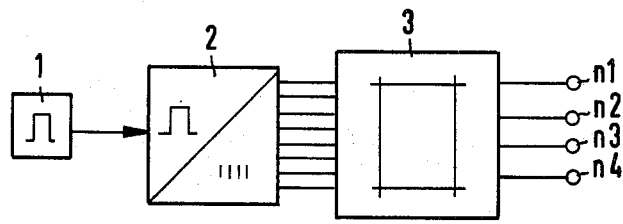
FIG. 2 is a block diagram showing the design principle of a control unit for controlling an inverter by means of a predetermined, fixed, firing pulse pattern.

FIG. 2 shows the control unit for the formation of firing control pulses for control of the inverter shown in FIG. 1 by means of a fixed pulse program. The control unit contains a variable-frequency oscillator 1 which generates a pulse sequence of a high pulse frequency amounting to $2^n$ times the operating frequency of the inverter. In the following description, an oscillator frequency of 25.6 kHz is assumed, i.e. $2^9$ times 50 Hz. The pulses from oscillator 1 are applied to the counting input of an 8-bit counter 2, operating as a forward counter with binary coding. Counter 2, divides the oscillator frequency down to the 50 Hz operating frequency of the inverter. The outputs of counter 2 are connected to the address inputs of a memory 3. A read-only memory, in particular, may be used as memory. In the embodiment example it is a 256×4 bit PROM. The counter words serve as addresses for memory 3. The memory words read out of the memory 3 contain the instructions required for the formation of the firing pulses, one output of memory 3 being associated with each controlled semiconductor valve. The memory outputs are, therefore, lettered with the valve designations.

Figure 3:
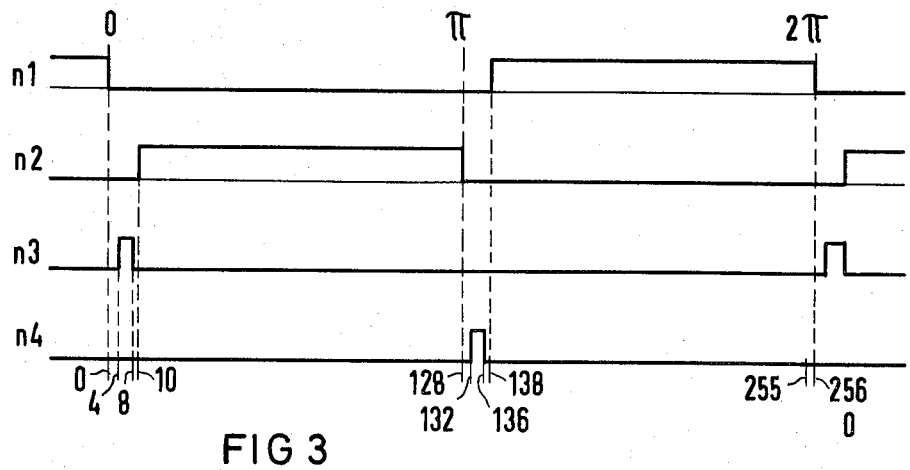
FIG. 3 is a diagram showing the firing pulse pattern of the control unit of FIG. 2.

It is evident from the pulse pattern of the firing pulses shown in FIG. 3 for one period of the inverter output voltage that a firing pulse for quenching valve n3 required for quenching main valve n1 starts shortly after the end of the main pulse n1 and ends shortly before the start of the main pulse n2. Analagously, to quench main valve n2, a quenching pulse n4 is required which starts shortly after the end of the main pulse n2 and ends shortly before the start of the main pulse n1.

The period is designated as $2\pi$, in the usual manner, at the upper edge of FIG. 3. Along the bottom, divisions of the period into $2^8 = 256$ increments are shown. Only those increments are indicated in which the state of the pulse pattern changes. Main pulse n1 starts at increment 138 and ends at increment 256. Main pulse n2 starts at increment 10 and ends at increment 128. Quenching pulse n3 starts at increment 4 and ends at increment 8. Quenching pulse n4 starts at increment 132 and ends at increment 136.

The generation of the pulse pattern by means of the programming of pulse pattern memory 3 is shown in FIG. 4. To assist in understanding, the decimal number equivalent is given in brackets next to the binary number in the memory address column. As will be understood by those skilled in the art, the memory content appears at the memory outputs upon selection of a memory address. It will be noted that the output line of pulse pattern memory 3 which is coupled to main valve n1 is a 0 signal from addresses 0 to 137, inclusive. At address 138 output n1 changes to a 1 signal which remains up to and including address 255. The output line for main valve n2 carries a 0 signal from address 0 to address 9, a 1 signal from address 10 to address 127 and, then, a 0 signal from address 128 to address 0 to address 3, a 1 signal from address 4 to address 7 and then a 0 signal thru address 255. The output line for quenching valve n4 carries a 0 signal from address 0 to address 131, a 1 signal from address 132 to 135, and then a 0 signal thru address 255. Since counter 2 generates the addresses continually and cyclically the outputs of pulse pattern memory 3 periodically carry the firing pulses shown in FIG. 3 for the controlled semiconductor valves of the inverter shown in FIG. 1.

In many applications it is not desirable to control the inverter exclusively by the pulse pattern shown in FIG. 3, but, rather, to use different pulse patterns as a function of another parameter, such as battery voltage. This can be accomplished by using a number of read-only memories which are connected in parallel on the output side and in which different auxiliary pulse patterns are stored. The address inputs of the memories are connected to the outputs of counter 2 through a multiplexer, for example. Then, responding to the control signal, the multiplexer switches the counter output to the address inputs of one of the memories. The control signal may be derived from a higher-ranking control device, such as a measured battery voltage value.

The inverter may also be controlled by different pulse programs by using a read-write memory for the pulse pattern memory in which the memory content is re-entered in defined cycles, preferably by a computer. The computer determines the pulse program required from suitable measurement quantities and thereby programs the pulse pattern memory cyclically.

Figure 5:
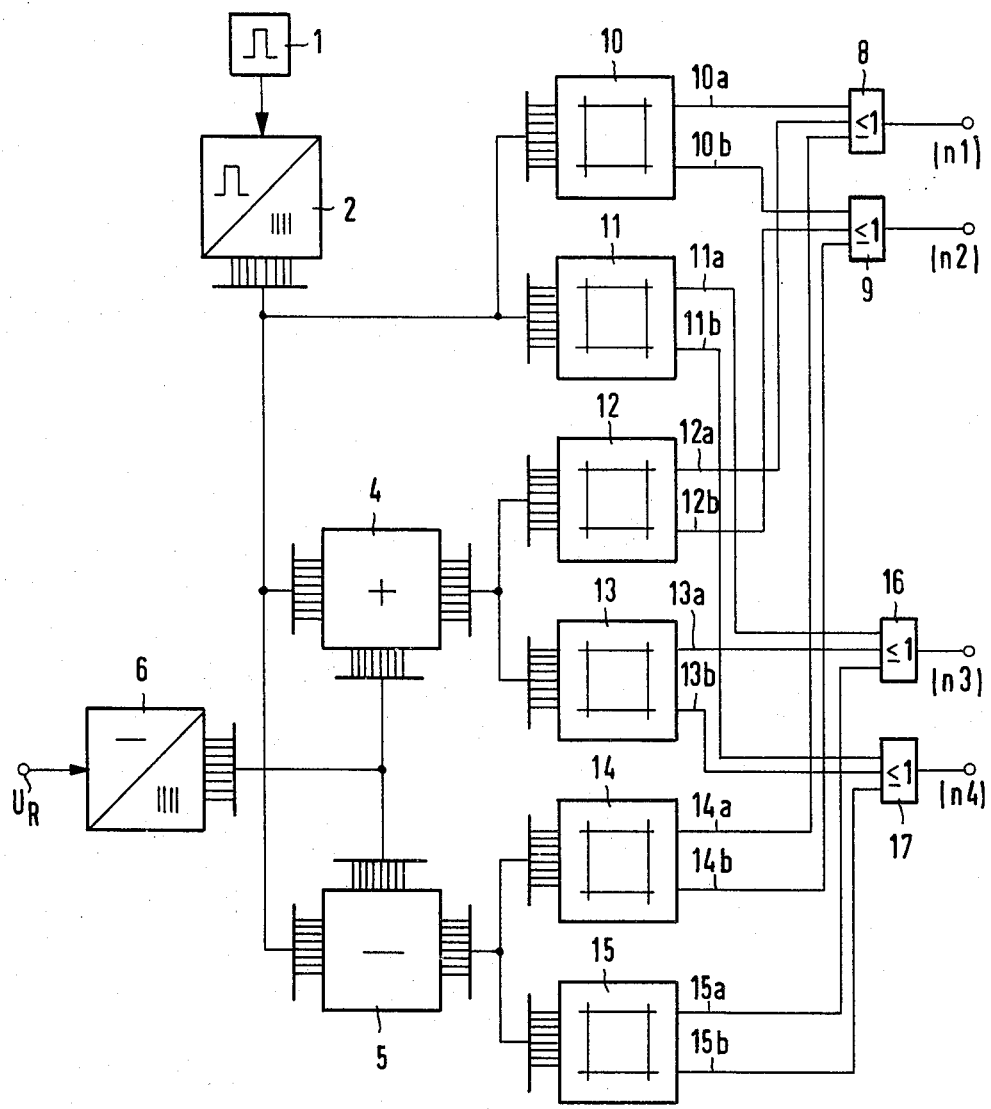
FIG. 5 is a block diagram showing the design principle of a control unit for controlling an inverter, according to the teachings of the invention.
Figure 6:
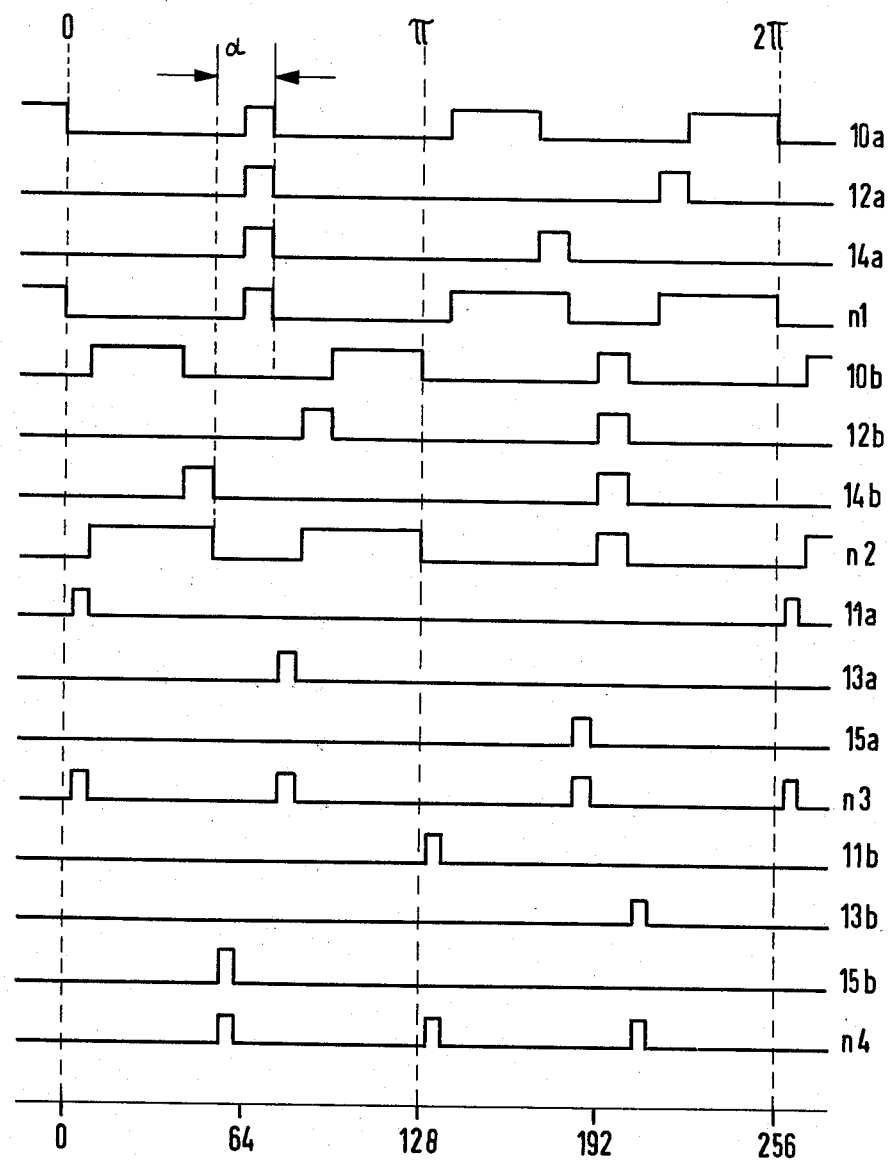
FIG. 6 is a timing diagram of the memory words and firing pulses of the main and quencher valves at minimum modulation for the control unit of FIG. 5.

FIG. 5 shows a control unit for control of the inverter of FIG. 1 using a pulse control method responding to a control angle which varies as a function of a control signal $U^R$. The control unit again contains an oscillator 1 and a counter 2, which now drives a number of pulse pattern memories 10 to 15, here 256×2-bit read-only memories. Stored in memories 10 to 15 are auxiliary pulse patterns as shown in the diagrams of FIG. 6. The address inputs of pulse pattern memories 10 and 11 are connected directly to the output of counter 2. The address inputs of pulse pattern memories 12 and 13 are connected to the sum output of an adder 4 whose first addend input is connected to the output of counter 2 and whose second addend input is connected to the output of an analog-to-digital converter 6. The address inputs of pulse pattern memories 14 and 15 are connected to the counter output and whose subtrahend input is connected to the output of analog/digital converter 6. The control voltage $U^R$ is applied to the analog input of analog/digital converter 6. The two outputs of pulse pattern memory 10 are marked 10a and 10b. The outputs of the other pulse pattern memories are marked in the same way, being given the reference number of the associated memory and the subscript a or b. The inputs of an OR gate 8 are wired to outputs 10a, 12a and 14b of pulse pattern memories 10, 12 and 14. The output of OR gate 8 carries the firing pulses for main valve n1. An OR gate 9, for producing firing pulses of main valve n2, is wired, on the input side, to outputs 10b, 12b and 14b of pulse pattern memories 10, 12 and 14. The firing pulses for quenching valve n3 are formed by OR gate 16 whose inputs are wired to outputs 11a, 13a and 15a of pulse pattern memories 11, 13 and 15. The firing pulses for quenching valve n4 are formed by OR gate 17 whose inputs are connected to outputs 11b, 13b and 15b of pulse pattern memories, 11, 13 and 15. The auxiliary pulse patterns are thus combined into the desired firing pulses in OR gates 8 and 9 and 16 and 17, respectively.

The momentary counter content of counter 2 directly forms the addresses for pulse pattern memories 10 and 11. The addresses for pulse pattern memories 14 and 15 are formed by subtraction of the output number of analog/digital converter 6 from the momentary content of the counter.

Figure 7:
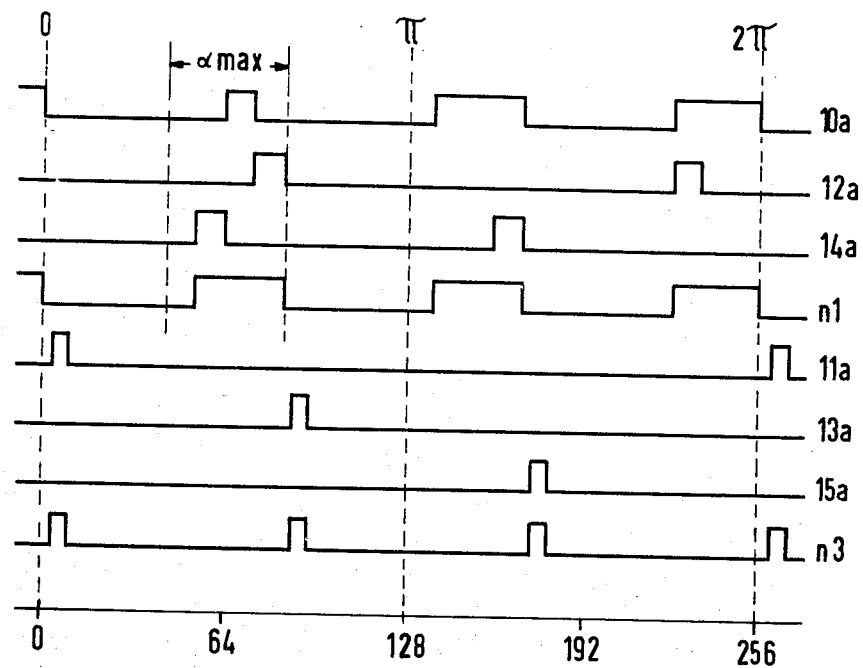
FIG. 7 is a timing diagram of the memory words and firing pulses for a main valve and a quenching valve at maximum modulation for the control unit of FIG. 5.

The operation of the control unit shown in FIG. 5 is now explained with reference to the diagrams shown in FIGS. 6 and 7. The cyclically progressing counter position is given on the base line of each figure. The pulse pattern shown in FIG. 6 begins at control signal $U_R=0$ and represents the pulse pattern having the smallest possible control angle, $\alpha$min. The momentary counter position directly forms the addresses supplied to all pulse pattern memories 10 to 15, since no address shifting occurs through adder 4 and subtracter 5. Accordingly, the programming of pulse pattern memories 10 to 15 with the auxiliary pulse pattern can be determined directly from the diagrams of FIG. 6 in the same manner. The pulse pattern shown in FIG. 7 is based on the case having the largest possible control signal and represents the pulse pattern having the greatest possible control angle, $\alpha$max. Relative to the momentary counter position, the addresses for pulse pattern memories 12 and 13 are shifted forward and the addresses for pulse pattern memories 14 and 15 are shifted backward by the same number, since adder 4 or subtracter 5 adds to or subtracts the number corresponding to the control signal $U_R$ from the momentary counter position.

The upper three lines in FIG. 6 show the wave shapes of the auxiliary pulse patterns signals appearing at outputs 10a, 12a and 14a of pulse pattern memories 10, 12 and 14 as a function of the addresses coinciding with the momentary counter position. The fourth line shows the wave shape of the firing pulses for main valve n1, which originate from disjunctive linkage of the auxiliary pulse patterns on memory outputs 10a, 12a and 14a. Lines five, six, and seven show the wave shapes of the auxiliary pulse patterns signals on outputs 10b, 12b, and 14b of pulse pattern memories 10, 12 and 14 as a function of the addresses coinciding with the momentary counter position. Main valve n2 firing pulses, shown in the eighth line, result, in turn, from disjunctive linkage of the auxiliary pulse patterns on memory outputs 10b, 12b and 14b. The ninth, tenth and eleventh line show the wave shapes of the auxiliary pulse pattern signals on outputs 11a, 13a and 15a of the pulse pattern memories 11, 13 and 15 as a function of the addresses coinciding with the momentary counter position. The firing pulses depicted in the twelvth line, for quenching valve n3, result from disjunctive linkage of the auxiliary pulse patterns on memeory outputs 11a, 13a and 15a. Lines thirteen, fourteen, and fifteen show the wave shapes of the auxiliary pulses signal on outputs 11b, 13b and 15b of pulse pattern memories 11, 13 and 15 as a function of the addresses coinciding with the momentary counter position. The quenching valve n4 firing pulses shown in line 16 result from disjunctive linkage of the auxiliary pulse patterns on memory outputs 11b, 13b and 15b.

The diagrams of FIG. 7 show the firing pulses for main valve n1 and for quenching valve n3 associated with it, as well as the signal shapes of the auxiliary pulse patterns on the memory outputs needed therefor. The firing pulses for both main valve n1 and quenching valve n4 are shifted by half a period relative to the firing pulses for both the main valve n1 and quenching valve n3 and, being otherwise the same, are not shown separately.

The wave shapes of the auxiliary pulse pattern signals on memory outputs 10a and 11a, shown in the first and fifth lines of FIG. 7, are identical with those of FIG. 6, because the control signal $U_R$ and the analog/digital converter 6 to which it is applied do not influence the address formation for pulse pattern memories 10 and 11. But the wave shapes of the auxiliary pulse pattern signals on memory outputs 12a and 13a of pulse pattern memories 12 and 13 are shifted to the right, by certain amount, relative to those of FIG. 6; the shapes of the auxiliary pulse pattern signals on outputs 14a and 15a of pulse pattern memories 14 and 15 are shifted to the left by the same amount. This signal shift is due to the address shift performed by adder 4 and subtracter 5, respectively, by the number given out by the analog/digital converter 6. This address shift has a direct relationship to control signal $U_R$ which is expressed in a shift of the auxiliary pulse pattern signals on memory outputs 14a and 15a to the left, respectively. This signal shift also influences the firing pulses so that the firing pulses for main valve n1, generated through disjunctive linkage of the auxiliary pulse patterns on memory outputs 10a, 12a and 14a and the firing pulses for quenching valve n3, generated through disjunctive linkage of the auxiliary patterns on memory outputs 11a, 13a and 15a, have a different pulse pattern that shown in FIG. 6.

The firing pulse pattern shown in FIG. 7 corresponds to the largest possible control angle, $\alpha$max, attainable with the control unit shown in FIG. 5. A larger control angle is not possible because the disjunctive linkage of the auxiliary pulse patterns on the various memory outputs would otherwise cause gaps to occur in the firing pulses. Such a restricted control angle range is sufficient for numerous applications.

Figure 8:
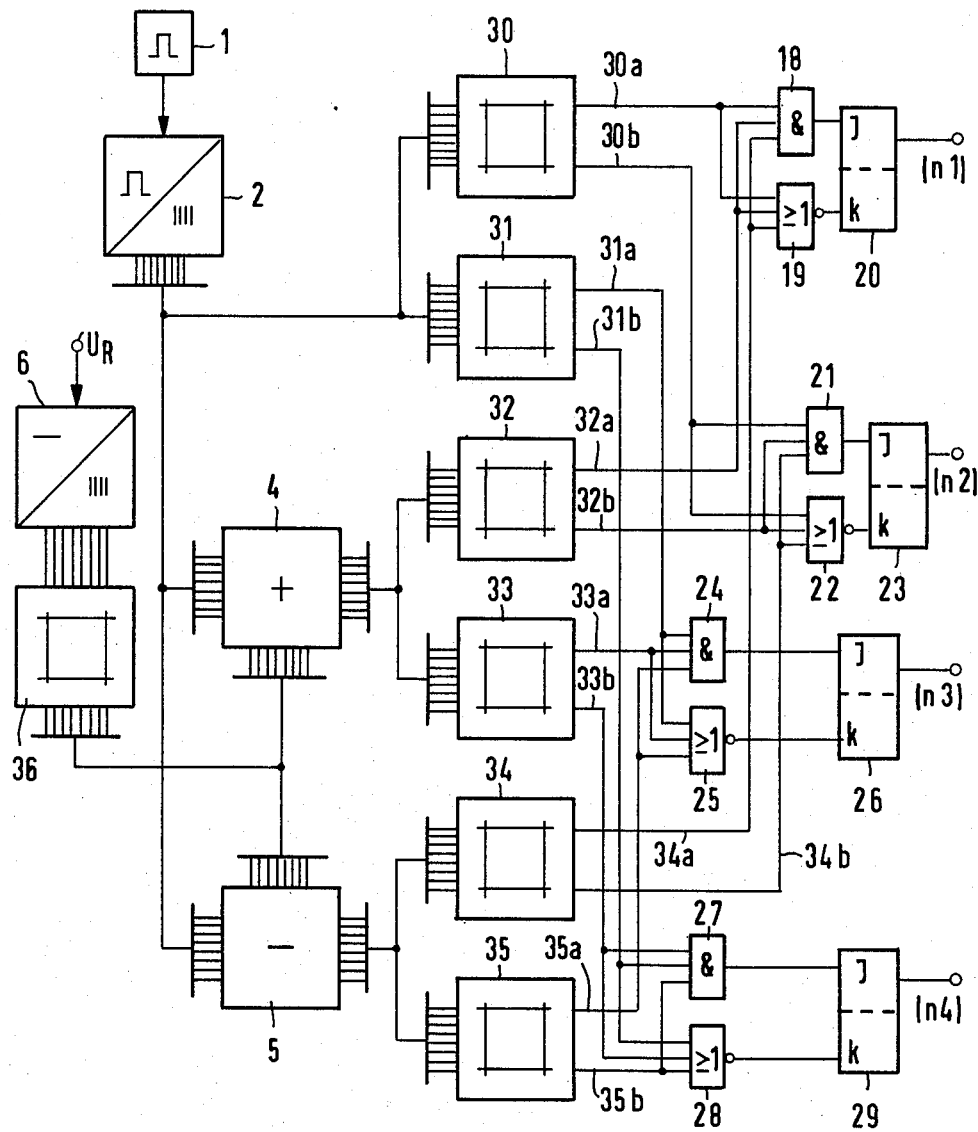
FIG. 8 shows the design principle of another illustrative embodiment in connection with a control unit for controlling an inverter according to the pulse control method, with expanded control range.
Figure 9:
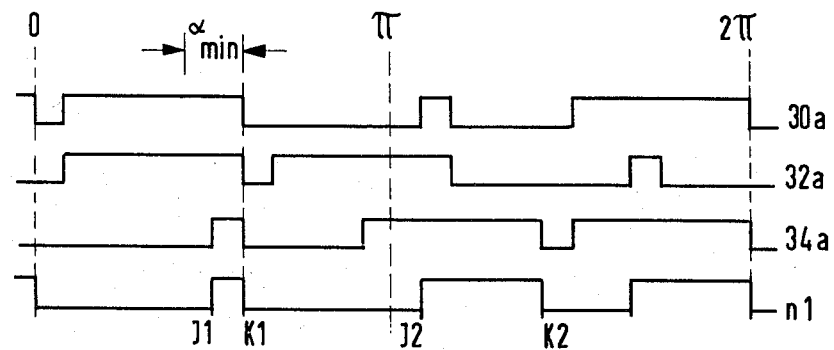
FIG. 9 is a chart of the memory words and firing pulse for a main valve at minimum modulation in the control unit of FIG. 8.

The control unit shown in FIG. 8 has larger controllable control angle range than the control unit of FIG. 5. Here again, the control unit contains an oscillator 1 which drives a counter 2; the pulse pattern memories 30 to 35 are 256×2-bit PROMs. The auxiliary pulse patterns depicted in the diagrams of FIG. 9 are stored in pulse pattern memories 30 to 35. The address inputs of pulse pattern memories 30 and 31 are connected directly to the outputs of counter 2. The address inputs of pulse pattern memories 32 and 33 are connected to the sum outputs of an adder 4, of which one addend input is connected to the counter output and whose second addend input is connected to the output of supplementary mentary 36. The address inputs of the pulse pattern memories 34 and 35 are connected to the difference output of a subtracter 5 whose minuend input is directly connected to the output counter 2 and whose subtrahend input is connected to the output of the other memory 36. The address input of supplementary memory 36 is connected to the output of an analog/digital converter 6 to whose analog input the control signal $U_R$ is applied. Memory 36, preferably a 256×8-bit PROM, is inserted between analog/digital converter 6 and the specific inputs to adder 4 and subtracter 5 and has the purpose of taking nonlinear relationships between the control signal $U_R$ and the control angle into account. As before, adder 4 and subtracter 5 effect a simultaneous address shift in one direction for pulse pattern memories 32 and 33 and in the opposite direction for pulse pattern memories 34 and 35. The address shift depends on the number read out of memory 36 and, hence, on the control signal $U_R$.

Pulse pattern memories 30 and 35 are programmed differently and the memory outputs are wired differently than in the control unit shown in FIG. 5. In the control unit of FIG. 8, memory outputs 30a, 32a and 34a of pulse pattern memories 30, 32 and 34 are connected to the inputs of AND gate 18 and, parallel thereto, to the inputs of NOR gate 19. AND gate 18 carries a 1 signal on the output side when a 1 signal is applied to each of its three inputs. The NOR gate carries a 1 signal at its output when a 0 signal is applied to all of its three inputs. The output of AND gate 18 is wired to the setting input J of a JK flip-flop 20 while the output of NOR gate 19 is connected to the reset input K of flip-flop 20. The output of flip-flop 20 supplies the firing pulse for main valve n1.

Flip-flop 23, whose setting input is connected to an AND gate 21 and whose reset input is connected to a NOR gate 22, is provided for the formation of the firing pulses for main valve n2. The inputs of both AND gate 21 and NOR gate 22 are connected in parallel to outputs 30b, 32b and 34b of pulse pattern memories 30, 32 and 34. A flip-flop 26, whose setting input is connected to an AND gate 24 and whose rest input is connected to NOR gate 25, is provided for the formation of the firing pulses for quenching valve n3. The inputs of gates 24 and 25 are connected in parallel to memory outputs 31a, 33a and 35a of pulse pattern memories 31, 33 and 35. A flip-flop 29, whose setting input is connected to an AND gate 27 and whose reset input is connected to a NOR gate 28, is provided for the formation of the firing pulses for quenching valve n4. The inputs of gates 27 and 28 are connected in parallel to memory outputs 31b, 33b and 35b of pulse pattern memories 31, 33 and 35.

Figure 10:
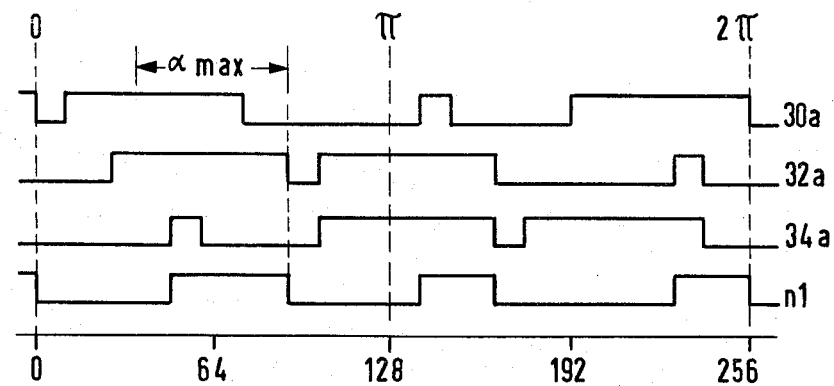
FIG. 10 is a chart of the memory words and firing pulse of the same main valve as in FIG. 9, at maximum modulation.

Operation of the control unit of FIG. 8 is explained with the assistance of the diagrams in FIGS. 9 and 10. FIG. 9 shows the pulse patterns of the auxiliary pulses and of the firing pulses for the main valve n1, at minimum modulation $\alpha$min, and FIG. 10 shows the pulse patterns of the auxiliary pulses and of the firing pulses for the main valve n1, at maximum modulation $\alpha$max. Again, the counter positions cyclically given out by the counter 2 are shown on a common base line.

It is assumed for the minimum control angle $\alpha$min that the control signal $U_R$ is zero at the output of supplementary memory 36, thus effecting no address shift. The momentary counter position forms the addresses for all pulse pattern memories 30 to 35 directly. The programming of pulse pattern memories 30 to 35 with the auxiliary pulse patterns can be determined from FIG. 9 in the same manner as in FIG. 4. The auxiliary pulse patterns on memory outputs 30a, 32a and 34a have the wave shape, shown over one period, obtained by corresponding programming of the pulse pattern memories 31, 32 and 34. At a time J1, all auxiliary pulse patterns on memory outputs 30a, 32a and 34a carry 1 signals. Flip-flop 20 is set via AND gate 18. At time K1, all auxiliary pulse patterns on memory outputs 31a, 32a and 34a carry 0 signals. Flip-flop 20 is reset via NOR gate 19. At time J2, all auxiliary pulse patterns on memory 30a, 32a and 34a carry the 1 signal. Flip-flop 20 is set again. At time K2, all auxiliary pulse patterns on memory outputs 30a, 32a and 34a have 0 signal again. The flip-flop is reset by the output signal of NOR gate 19.

The firing pulse patterns for the other controlled valves are formed in the same way from auxiliary pulse patterns and, therefore, need not be described once more in detail.

The diagrams of FIG. 10 are based on the maximum address shift possible. The auxiliary pulse pattern from output 30a of pulse pattern memory 30 shown in the first line is unchanged relative to that of FIG. 9 because the address shift does not affect memories 30 and 31. Relative to FIG. 9, the auxiliary pulse pattern from output 32a of pulse pattern memeory 32 is shifted to the right and the auxiliary pulse pattern from output 34a of pulse pattern memory is shifted to the left by the same amount, in consequence of the address shift by adder 4 and subtracter 5, respectively.

In the practical realization of the above circuits, memories 10, 11; 12, 13; 14, 15;, 30, 31; 32, 33; 34, 35, respectively are each advantageously combined into one memory with four outputs.

In order to make the invention more easily understood, it has been described only in its application to single-phase, two-pulse inverters. An expansion to multiple-phase and higher-pulse inverters is possible without difficulty by providing the appropriate multiple memory space and necessary components. For example, six main valve pulse patterns each shifted by 60° electrical, and six quenching valve pulse patterns each shifted by 60° electrical, can each be stored in one memory with 12 outputs for the uncontrolled operation of a three-phase, six-pulse inverter. Each memory output is, again, associated with a valve of the inverter. For control by a pulse method an appropriate nuember of memories must be provided.

What is claimed is:

1. A circuit for forming a periodic pulse pattern comprising:

an oscillator having an output;

a binary-coded counter having an input coupled to the output of the oscillator, the counter having an address signal as an output;

a first memory containing a first auxiliary pulse pattern, the memory having the address signal as an input and having an auxiliary periodic pulse pattern as an output;

address shifting means comprising at least one of an adder or a subtractor having a first input coupled to the output of the counter and a second input coupled to a number determined by a control signal, the address shifting means having an output signal;

a second memory containing a second auxiliary pulse pattern, the second memory having an address input coupled to the output of the address shifting means and having a second auxiliary pulse pattern as an output; and logic means having the outputs of the memories as inputs and having the periodic pulse pattern as outputs.

2. A circuit in accordance with claim 6 and further comprising:

a third memory having the control signal as an address input and having the number determined by the control signal as an output.

3. A circuit in accordance with claims 1 or 2 and further comprising:

a static inverter having plural controlled valves each of which has an input for firing pulses, the input of each controlled valve being coupled to an output of the logic means.

* * * * *